US009613913B2

(12) United States Patent
Choi et al.

(10) Patent No.: US 9,613,913 B2
(45) Date of Patent: Apr. 4, 2017

(54) METHOD OF FORMING ELECTROMAGNETIC INTERFERENCE SHIELDING LAYER OF BALL GRID ARRAY SEMICONDUCTOR PACKAGE AND BASE TAPE FOR THE METHOD

(71) Applicant: PROTEC CO., LTD., Gyeonggi-do (KR)

(72) Inventors: Sung Hwan Choi, Gyeonggi-Do (KR); Tae Sup Han, Gyeonggi-Do (KR)

(73) Assignee: PROTEC CO., LTD., Gyeonggi-do (KR)

( * ) Notice: Subject to any disclaimer, the term of this patent is extended or adjusted under 35 U.S.C. 154(b) by 0 days.

(21) Appl. No.: 15/155,086

(22) Filed: May 16, 2016

(65) Prior Publication Data

US 2016/0343671 A1    Nov. 24, 2016

(30) Foreign Application Priority Data

May 19, 2015    (KR) ........................ 10-2015-0069520

(51) Int. Cl.
| | | |
|---|---|---|
| *H01L 21/00* | (2006.01) | |
| *H01L 23/552* | (2006.01) | |
| *H01L 21/285* | (2006.01) | |
| *H01L 21/3205* | (2006.01) | |
| *H01L 21/683* | (2006.01) | |
| *H01L 23/00* | (2006.01) | |

(52) U.S. Cl.
CPC ........ *H01L 23/552* (2013.01); *H01L 21/2855* (2013.01); *H01L 21/32051* (2013.01); *H01L 21/6836* (2013.01); *H01L 24/14* (2013.01); *H01L 2221/68381* (2013.01); *H01L 2224/13014* (2013.01); *H01L 2224/13016* (2013.01); *H01L 2924/3025* (2013.01)

(58) Field of Classification Search
None
See application file for complete search history.

(56) References Cited

U.S. PATENT DOCUMENTS

| | | | |
|---|---|---|---|
| 7,687,283 B2 * | 3/2010 | Terui | ................... H01L 23/3114 257/E21.599 |
| 8,597,979 B1 | 12/2013 | Burgyan | |
| 2012/0175761 A1 | 7/2012 | Zenbutsu | |

(Continued)

FOREIGN PATENT DOCUMENTS

| | | |
|---|---|---|
| JP | 2010283147 | 12/2010 |
| KR | 1014792480000 | 12/2014 |
| KR | 1020150120794 | 10/2015 |

*Primary Examiner* — Angel Roman
(74) *Attorney, Agent, or Firm* — Jianq Chyun IP Office

(57) ABSTRACT

Provided are a method of forming an electromagnetic interference (EMI) shielding layer of a ball grid array (BGA) semiconductor package, and a base tape used in the method, and more particularly, a method of forming a shielding layer for blocking EMI, on an upper surface and lateral surfaces of a BGA semiconductor package having a lower surface, on which a plurality of solder balls are formed, and a base tape used in the method.

According to the method of forming an EMI shielding layer of a BGA semiconductor package, the EMI shielding layer may be formed on the BGA semiconductor package quickly, easily, and effectively by using the base tape, thereby not only improving process productivity but also remarkably reducing the manufacturing costs.

3 Claims, 3 Drawing Sheets

(56) References Cited

U.S. PATENT DOCUMENTS

| | | | |
|---|---|---|---|
| 2014/0264784 A1* | 9/2014 | Ho | H01L 23/552 |
| | | | 257/659 |
| 2015/0173258 A1* | 6/2015 | Chen | H05K 13/046 |
| | | | 361/753 |
| 2016/0111375 A1* | 4/2016 | Bair | H01L 23/552 |
| | | | 438/110 |

* cited by examiner

METHOD OF FORMING ELECTROMAGNETIC INTERFERENCE SHIELDING LAYER OF BALL GRID ARRAY SEMICONDUCTOR PACKAGE AND BASE TAPE FOR THE METHOD

CROSS-REFERENCE TO RELATED APPLICATION

This application claims the benefit of Korean Patent Application No. 10-2015-0069520, filed on May 19, 2015, in the Korean Intellectual Property Office, the disclosure of which is incorporated herein in its entirety by reference.

BACKGROUND

1. Field

One or more embodiments relate to a method of forming an electromagnetic interference (EMI) shielding layer of a ball grid array (BGA) semiconductor package and a base tape used in the method, and more particularly, to a method of forming a shielding layer for blocking EMI, on an upper surface and lateral surfaces of a BGA semiconductor package having a lower surface, on which a plurality of solder balls are formed, and a base tape used in the method.

2. Description of the Related Art

A semiconductor package typically includes an electromagnetic interference (EMI) shielding layer on an outer surface thereof in order to prevent emission of electromagnetic waves or damages to internal circuit thereof by external electromagnetic waves.

According to the related art, a shielding layer is formed by coating a tray with a liquid adhesive to form a layer with a uniform thickness by using a squeeze, and then by disposing a semiconductor package on the tray and adhering the same to the tray. While the semiconductor package is adhered to the tray, sputtering is performed on the semiconductor package to form an EMI shielding layer on an upper surface and lateral surfaces of the semiconductor package except a lower surface of the semiconductor package. When sputtering is completed, the semiconductor package is separated from the tray to complete the formation of the shielding layer.

In the method of forming an EMI shielding layer as in the related art, equipment for coating the tray with a liquid adhesive and equipment for adhering the semiconductor package to the tray and hardening the same are used. However, the equipment is very expensive, and thus, costs of the method of forming an EMI shielding layer according to the related art is very high. In addition, the method includes an operation of coating a releasing agent on the adhesive of the tray to facilitate separating the adhesive from the semiconductor package, making the whole method complicated and increasing the costs.

SUMMARY

One or more embodiments include a method of forming an electromagnetic interference (EMI) shielding layer of a ball grid array (BGA) semiconductor package, whereby the EMI shielding layer may be formed effectively, the process may be simplified, and the manufacturing costs may be reduced, and a base tape used in the method.

Additional aspects will be set forth in part in the description which follows and, in part, will be apparent from the description, or may be learned by practice of the presented embodiments.

According to one or more embodiments, a method of forming an EMI shielding layer of a BGA semiconductor package on external surfaces of the BGA semiconductor package to shield EMI, includes: (a) providing a BGA semiconductor package having a lower surface, on which a plurality of solder balls are formed; (b) providing a base tape having an attaching portion that is thicker than a height of the solder balls and is formed of an elastic adhesive material; (c) forming a package-tape assembly by pressing the BGA semiconductor package against the base tape such that the plurality of solder balls of the BGA semiconductor package are sunk into the attaching portion of the base tape and the BGA semiconductor package is adhered to the base tape; (d) forming the EMI shielding layer on the BGA semiconductor package by sputtering a conductive layer on the package-tape assembly; and (e) removing the base tape from the package-tape assembly.

In addition, a base tape may be used in the method of forming an EMI shielding layer of a BGA semiconductor package described above.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, a method of forming an electromagnetic interference (EMI) shielding layer of a ball grid array (BGA) semiconductor package according to embodiments of the inventive concept will be described more fully with reference to the accompanying drawings, in which exemplary embodiments of the application are shown.

First, a method of forming an EMI shielding layer of a BGA semiconductor package according to an embodiment of the inventive concept will be described.

Figure 1:
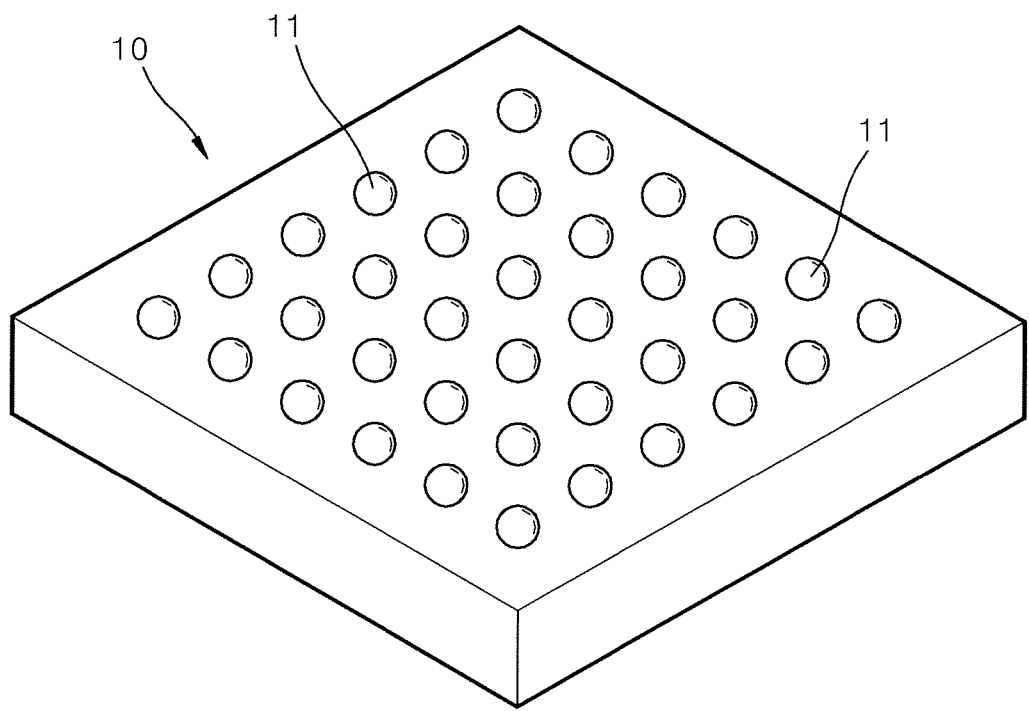
FIG. 1 is a perspective view of an example of a ball grid array (BGA) semiconductor package used in a method of forming an electromagnetic interference (EMI) shielding layer of a BGA semiconductor package, according to an embodiment of the inventive concept.

FIG. 1 is a perspective view of an example of a BGA semiconductor package 10 used in a method of forming an EMI shielding layer of a BGA semiconductor package, according to an embodiment of the inventive concept. FIGS. 2 through 5 are views for describing a method of forming an EMI shielding layer of the BGA semiconductor package 10 by using the BGA semiconductor package 10 illustrated in FIG. 1, according to an embodiment of the inventive concept.

The BGA semiconductor package 10 according to the inventive concept has a structure as illustrated in FIG. 1. FIG. 1 is a perspective in which the BGA semiconductor package 10 is turned upside down so as to show its lower surface and solder balls 11 of the BGA semiconductor package 10. As illustrated in FIG. 1, a plurality of solder balls 11 are mounted on the lower surface of the BGA semiconductor package 10. EMI is blocked in that a conductive layer are formed on an upper surface and lateral surfaces of the BGA semiconductor package 10 except the lower surface thereof, on which the solder balls 11 are formed. In order to form an EMI shielding layer 31 as described above, a conductive layer is formed on surfaces of the BGA semiconductor package 10 except the lower surface of the BGA semiconductor package 10, on which the solder balls 11 are formed, while covering the lower surface of the BGA semiconductor package 10.

First, the BGA semiconductor package 10 having the lower surface, on which the plurality of solder balls 11 are formed, is provided as illustrated in FIG. 1 in step (a). The BGA semiconductor package 10 is provided as a finished product.

Figure 2:
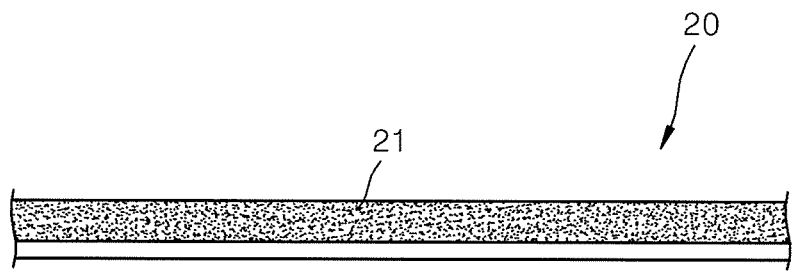
FIGS. 2 through 5 are views for describing a method of forming an EMI shielding layer of a BGA semiconductor package by using the BGA semiconductor package illustrated in FIG. 1, according to an embodiment of the inventive concept.
Figure 3:
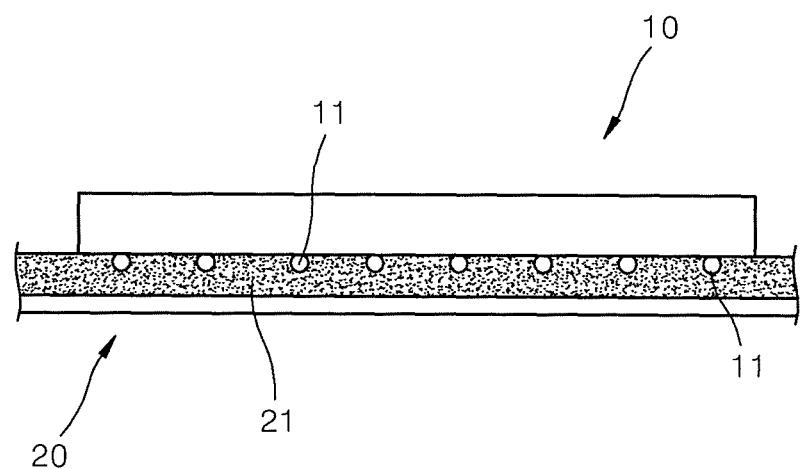

Next, as illustrated in FIG. 2, a base tape 20 having an attaching portion 21 formed of an elastic adhesive material is provided in step (b). Referring to FIG. 3, a thickness of the attaching portion 21 of the base tape 20 is greater than a height of the solder balls 11 of the BGA semiconductor package 10. The attaching portion 21 of the base tape 20 may be formed of an adhesive material which is relatively soft. As the thickness of the attaching portion 21 is greater than the height of the solder balls 11, the attaching portion 21 may completely surround the solder balls 11 and contact the lower surface of the BGA semiconductor package 10 to be adhered thereto at the same time.

While the BGA semiconductor package 10 and the base tape 20 are provided as above, the BGA semiconductor package 10 is pressed against the base tape 20 so as to attach the BGA semiconductor package 10 to the base tape 20 as illustrated in FIG. 3 in step (c). As the attaching portion 21 of the base tape 20 has soft properties, the attaching portion 21 is elastically and/or plastically deformed by the solder balls 11 of the BGA semiconductor package 10 so that the solder balls 11 are sunk into the attaching portion 21. That is, the solder balls 11 are dug into the attaching portion 21 to be surrounded by the attaching portion 21, and the lower surface of the BGA semiconductor package 10 is adhered to the base tape 20. That is, the lower surface of the BGA semiconductor package 10 and the solder balls 11 are adhered to the attaching portion 21 of the base tape 20, thereby being blocked from the outside. When the BGA semiconductor package 10 is pressed to a predetermined depth with an appropriate force, the entire outer surfaces of the solder balls 11 are completely surrounded by the attaching portion 21 of the base tape 20 as described above, and the lower surface of the BGA semiconductor package 10 contacts the attaching portion 21. The attaching portion 21 is basically elastically deformed but is then plastically deformed after a predetermined threshold point so as to more completely cover the solder balls 11 and also seamlessly cover the lower surface of the BGA semiconductor package 10.

Figure 4:
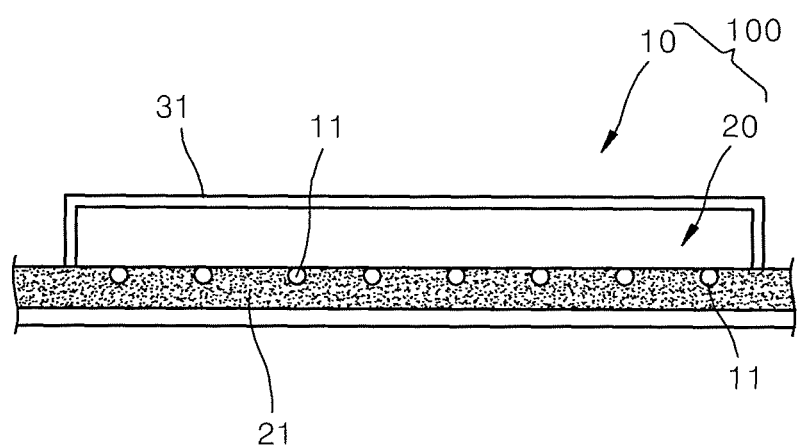

As described above, in step (d), the EMI shielding layer 31 is formed on the BGA semiconductor package 10 by performing sputtering on a package-tape assembly 100 formed by adhering the base tape 20 to the BGA semiconductor package 10 as illustrated in FIG. 4. The attaching portion 21 of the base tape 20 is formed of a material that is chemically stable and is resistant to a sputtering temperature, and thus, the conductive EMI shielding layer 31 is formed only on the upper surface and the lateral surfaces of the BGA semiconductor package 10, and not on the lower surface of the BGA semiconductor package 10. As a result, the possibility that the solder balls 11 of the BGA semiconductor package 10 are electrically connected to one another and cause failure is prevented.

Figure 5:
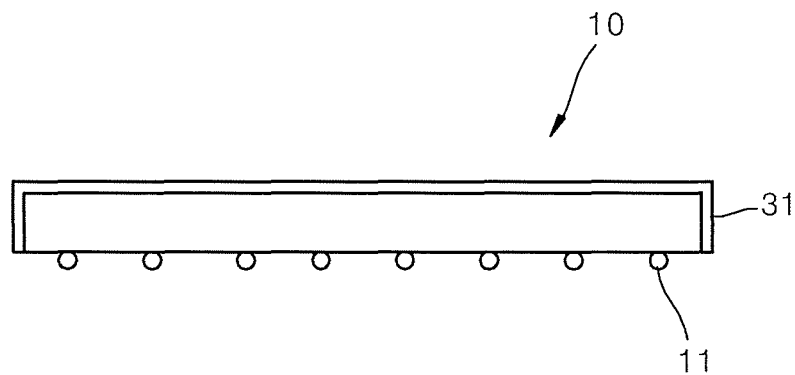

When the process of forming the EMI shielding layer 31 on the package-tape assembly 100 is completed as described above, the base tape 20 is removed from the package-tape assembly 100 as illustrated in FIG. 5 in step (e). The base tape 20 may be removed using various methods depending on a material of the attaching portion 21. According to the material of the attaching portion 21, the base tape 20 may be removed from the BGA semiconductor package 10 by pressurizing and then pulling the base tape 20 while having the BGA semiconductor package 10 in a fixed state. Alternatively, the base tape 20 may be torn off by heating the base tape 20 so that the attaching portion 21 becomes soft and has weakened adhesive force. According to circumstances, the base tape 20 may be heated to a higher temperature so that the attaching portion 21 is melted to be spontaneously separated from the BGA semiconductor package 10.

Next, a method of forming an EMI shielding layer of a BGA semiconductor package according to another embodiment of the inventive concept will be described with reference to FIGS. 6 and 7.

Figure 6:
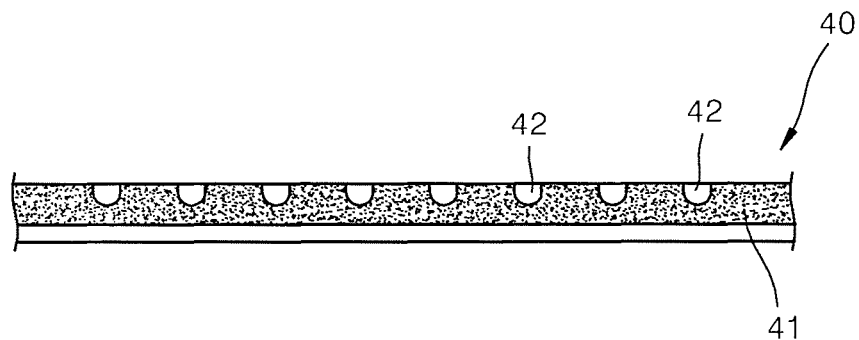
FIGS. 6 and 7 are views for describing a method of forming an EMI shielding layer of a BGA semiconductor package by using the BGA semiconductor package illustrated in FIG. 1, according to another embodiment of the inventive concept.
Figure 7:
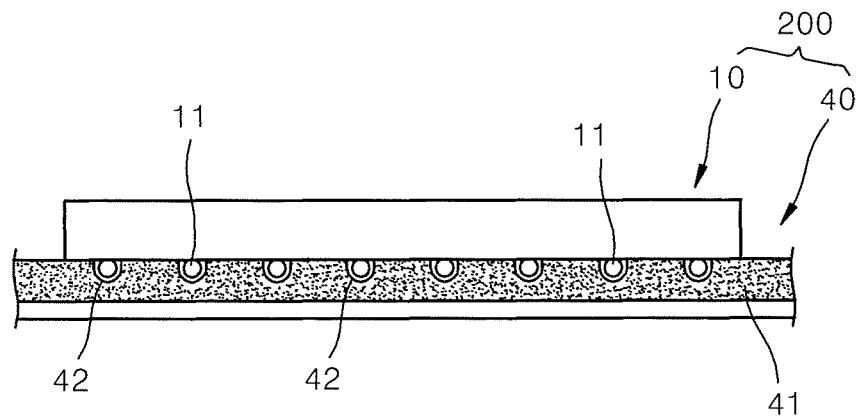

The method of forming an EMI shielding layer of the BGA semiconductor package according to the embodiment of FIGS. 6 and 7 is different from the method of forming the EMI shielding layer 31 of the BGA semiconductor package 10 in that a base tape 40 having an attaching portion 41 with ball holes 42 is used as illustrated in FIGS. 6 and 7.

Step (a) of the method according to the embodiment of FIGS. 6 and 7 is the same as that of the method of forming an EMI shielding layer of a BGA semiconductor package according to the previous embodiment.

According to the method of forming an EMI shielding layer of the BGA semiconductor package of the embodiment of FIGS. 6 and 7, in step (b), the attaching portion 41 having ball holes 42, which are at positions corresponding to the solder balls 11 of the BGA semiconductor package 10, is used as illustrated in FIG. 6. The ball holes 42 of the attaching portion 41 are formed to be concave compared to the planar surroundings, or may have shapes corresponding to those of the solder balls 11 on the lower surface of the BGA semiconductor package 10 according to circumstances.

In step (c), while the solder balls 11 of the BGA semiconductor package 10 are disposed to respectively face the ball holes 42 of the attaching portion 41, the BGA semiconductor package 10 may be pressed against the attaching portion 41 by using the base tape 40 so as to form a package-tape assembly 200 as illustrated in FIG. 7. In this case, the attaching portion 41 around the ball holes 42 may not completely surround the solder balls 11 as illustrated in FIG. 7. Also in this case, the attaching portion 41 of the base tape 40 completely hermetically seals the lower surface of the BGA semiconductor package 10 with respect to the outside, and thus, even when an EMI shielding layer 31 is formed in step (d), the EMI shielding layer 31 is not formed on the lower surface of the BGA semiconductor package 10.

When step (d) of forming the EMI shielding layer 31 is completed, the base tape 40 is removed in step (e) to complete the method of forming the EMI shielding layer of the BGA semiconductor package according to the embodiment of FIGS. 6 and 7.

According to the method of forming an EMI shielding layer of a BGA semiconductor package, the EMI shielding layer may be formed quickly, easily, and effectively on the BGA semiconductor package by using a base tape, thereby not only improving process productivity but also remarkably reducing the costs.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A method of forming an electromagnetic interference (EMI) shielding layer of a ball grid array (BGA) semiconductor package on external surfaces of the BGA semiconductor package to shield EMI, the method comprising:
   (a) providing a BGA semiconductor package having a lower surface, on which a plurality of solder balls are formed;
   (b) providing a base tape having an attaching portion that is thicker than a height of the solder balls and is formed of an elastic adhesive material, wherein ball holes that are concave are formed in the attaching portion of the base tape at positions respectively corresponding to the solder balls of the BGA semiconductor package;
   (c) forming a package-tape assembly by pressing the BGA semiconductor package against the base tape such that the plurality of solder balls of the BGA semiconductor package are sunk into the attaching portion of the base tape and the BGA semiconductor package is adhered to the base tape, wherein the package-tape assembly is formed by pressing the BGA semiconductor package against the attaching portion while the solder balls of the BGA semiconductor package are disposed to respectively face the ball holes of the attaching portion;
   (d) forming the EMI shielding layer on the BGA semiconductor package by sputtering a conductive layer on the package-tape assembly; and
   (e) removing the base tape from the package-tape assembly.

2. The method of claim 1, wherein the attaching portion of the base tape is elastically and plastically deformed during (c) so as to cover all of the solder balls of the BGA semiconductor package and to be adhered to the lower surface of the BGA semiconductor package.

3. The method of claim 1, wherein in (e), the package-tape assembly is heated to separate the base tape from the BGA semiconductor package.

* * * * *